United States Patent [19]
Pritchard

[11] Patent Number: 4,809,336
[45] Date of Patent: Feb. 28, 1989

[54] SEMICONDUCTOR AMPLIFIER WITH TUBE AMPLIFIER CHARACTERISTICS

[76] Inventor: Eric K. Pritchard, 1702 Plymouth Ct., Bowie, Md. 20716

[21] Appl. No.: 29,144

[22] Filed: Mar. 23, 1987

[51] Int. Cl.<sup>4</sup> ............................................. H03G 3/00
[52] U.S. Cl. .................................... 381/61; 381/98; 307/546
[58] Field of Search ................. 330/202, 297, 77, 79, 330/196; 84/1.16, 1.19; 381/61, 98, 106, 83, 93; 307/546, 566

[56] References Cited

U.S. PATENT DOCUMENTS

| | | | |
|---|---|---|---|
| 3,008,092 | 11/1961 | Cawthra | 330/79 |
| 3,368,159 | 2/1968 | Richman | 330/79 |
| 3,382,450 | 5/1968 | Rockwell | 330/77 |
| 3,399,277 | 8/1968 | Davis et al. | 330/77 |
| 3,860,876 | 1/1975 | Woods | 328/167 |
| 3,939,428 | 2/1976 | Shimizu et al. | 455/253 |
| 3,973,461 | 8/1976 | Jahns | 84/1.24 |
| 4,000,474 | 12/1976 | Todokoro | 330/35 |
| 4,143,245 | 3/1979 | Scholz . | |
| 4,180,707 | 12/1979 | Moog | 84/1.24 X |
| 4,211,893 | 7/1980 | Smith | 330/149 X |
| 4,286,492 | 9/1981 | Claret | 84/1.27 |
| 4,405,832 | 9/1983 | Sondermeyer . | |
| 4,439,742 | 3/1984 | Sondermeyer | 330/262 |
| 4,538,297 | 8/1985 | Waller, Jr. | 381/94 |
| 4,578,818 | 3/1986 | Claydon | 381/94 |
| 4,680,795 | 7/1987 | Ecklund | 381/98 |

OTHER PUBLICATIONS

Linear Applications, vol. 1 (National Semiconductor), p. AN20-4, Feb. 1969, "An Applications Guide for Operational Amplifiers".
Jung, IC OP-AMP Cookbook, 1980, p. 443, FIG. 17, p. 448, FIGS. 1-2, p. 465, "Driving Capacitive Loads".

*Primary Examiner*—Forester W. Isen
*Attorney, Agent, or Firm*—Barnes & Thornburg

[57] ABSTRACT

A distortion synthesizer having a transformerless filter of a defined bandwidth and providing circuitry for narrowing of the bandwidth filter as a function of the amplitude of the input signal. This includes an input amplifier having a limiter connected between the input amplifier and the band pass filter with feedback between the output of the band pass filter and the input of the amplifier. The limiter is actuated at a given input signal to limit the amplitude and thereby reduce the feedback narrowing the frequency response. A bias shifter connected to the input of the amplifier asymmetrically transmits the input signal and in combination with the limiter produces even harmonics. A feed forward embodiment is also disclosed. Diode structure provided in an output stage brings flyback into the audible range allowing the flyback voltages to exceed the power supply voltages. The time constant of the bias shifter is sufficiently long to prolong the bias shifting to allow attack time for the note.

29 Claims, 3 Drawing Sheets

SEMICONDUCTOR AMPLIFIER WITH TUBE AMPLIFIER CHARACTERISTICS

BACKGROUND AND SUMMARY OF THE INVENTION

The present invention relates generally to amplifiers and more specifically to all forms of audio amplifiers and guitar amplifiers. It further relates to a distortion synthesizer which replicates the sounds produced by overdriven vacuum tube amplifiers.

Since semiconductor devices have become viable components for amplifiers, there has been a debate upon the virtues of semiconductor or solid state amplifiers versus the vacuum tube amplifiers. Some believe that tube amplifiers work better because vacuum tubes are more natural amplifiers than semiconductor devices. Some think that semiconductor amplifiers produce a sound that has no warmth; they are too clear until the semiconductor devices saturate, then they are too noisy. Tube amplifiers seem not to give up when overdriven, they seem to try to reach the impossible.

The vacuum tube amplifiers, however, do have some limitations. For some people, the limitation is simply the warmup time and the fragility of vacuum tubes. For guitarists the problems are more serious. A powerful amplifier does not sound right when operating at low levels such as those needed to fill a small room.

The prior art is filled with various attempts to satisfy the guitarists need for the tube amplifier sound with the more reliable semiconductor devices or just to enhance the sound from vacuum tube amplifiers. Moog, in U.S. Pat. No. 4,180,707, simulates the overdriven amplifier with a compressor and a clipper that can produce even harmonics as well as odd harmonics to produce the guitar sound at preamplifier power levels. Claret, in U.S. Pat. No. 4,286,492, modifies the operating point of the amplifier to clip at lower power. Woods, in U.S. Pat. No. 3,860,876, heavily modifies the frequency response of a distorted input. Smith, in U.S. Pat. No. 4,211,893, selectively adds gain in a preamplifier stage to get distortion. Sondermeyer, in U.S. Pat. No. 4,405,832, switchable forces odd harmonic distortion and, in U.S. Pat. No. 4,439,742, creates a soft crossover distortion, also an odd harmonic phenomenon. Scholz, in U.S. Pat. No. 4,143,245, creates distortion at any sound level by operating an amplifier at maximum levels with resistive loads and driving the speaker with only a portion of the amplifier output.

In another vein, Todokoro, in U.S. Pat. No. 4,000,474, simulates a triode tube amplifier with junction field effect transistors.

The prior art is also filled with many examples of design built by many manufacturers of guitar amplifiers. Technically, the guitar amplifier is a poor example of vacuum tube amplifier design. Certainly, the guitar amplifier of today does not have the frequency response nor the clarity of the high fidelity amplifier of yesterday. However, the reason is not technical but lies in the art. The sound of inexpensive, overdriven amplifiers became part of the art.

Thus, to simulate the vacuum tube amplifier, one must fully appreciate the nature of the components of said amplifier. One of the key components of a vacuum tube amplifier is the output transformer. The transfer passes a relatively narrow band of frequencies in the middle of the audio spectrum. The feedback in the power stage of the amplifier broadens the transformer response so that the amplifier operates effectively over a wider range of frequencies. However, when the amplifier tubes are saturated, they cannot perform the feedback function and the response narrows to the transformer response.

Of course, another key element of the vacuum tube amplifier is the tube itself. The various stages of a vacuum tube amplifier are usually coupled with capacitors that carry the signal from the output of one stage to the input of the next while blocking the constant or DC voltage of the output from the input. When the input of a stage is driven so that the grid of the vacuum tube becomes more positive than its cathode, then significant currents will flow in the grid circuit. Some of the grid current charges the coupling capacitor and thereby alters the operating point of the vacuum to amplify more asymmetrically than it usually does. When this asymmetrical waveform is amplified and clipped symmetrically by a push-pull output stage, as usually found in powerful amplifiers, it produces even as well as odd distortion harmonics. It is the even harmonics that seem to be more musical than the harsher odd harmonics.

Another feature of vacuum tubes and their circuitry is that vacuum tubes permit the plate voltage to become considerably more negative than the cathode. Transistors, however, saturate and then blow out their emitter junction The solution, simply put, is to incorporate a diode to bypass the current from the collector or drain to the emitter or source. This extra current path is not found in tube amplifiers and interferes with the ability of the transformer and speaker inductances to flyback.

Thus, the primary object of the invention is to provide a semiconductor amplifier which simulates the distortion of a vacuum tube amplifier. The most important feature of this simulation is the bandwidth narrowing at elevated power levels.

Another object of the invention is to simulate the effects of grid current flowing This produces even harmonic distortion which is a more pleasant and musical distortion than one made of solely odd harmonics. Further, the grid current effects in a capacitively coupled circuit produces the desirable attach on a note.

A further object of the invention is a guitar amplifier effects preamplifier which may be elegantly professional or may be a simple effects pedal. This is quite possible from the teachings herein because the tube simulation may be done either at low or at high power levels.

A further object of the invention is to provide a semiconductor power amplifier which permits the speaker inductance to flyback to voltages greater than the supply voltage so that the speaker current can reverse as fast as possible.

A still further objection of the invention is to achieve the general improvement of guitar amplifiers of all types to provide the high power distortion effect at all power levels.

An even further object of the invention is to provide a general use power amplifier which graciously handles excessive inputs.

These and other objects of the invention are attained by providing a distortion synthesizer having a transformless filter of a defined bandwidth and providing a circuitry for narrowing the bandwidth of the filter as a function of the amplitude of the input signal. The filter generally includes a bandpass filter and an input amplifier. The narrowing circuit includes a limiter connected between the output of the amplifier and the input of the filter and a feedback connecting the output of the filter to the amplifier. The limiter is actuated at a given level of input signal to limit the amplitude to reduce the feedback capability and consequently narrow the frequency response. The frequency response of the filters are adjustable.

A bias shifter may be provided between the input terminal and the input to the amplifier for asymmetrically transmitting the input signals. The bias shifter in combination with the limiter introduces even harmonics. The base shifter is also actuated above a given input signal. A capacitor and a symmetrical resistance of the bias shifter have a time constant sufficient to prolong the bias shifting to allow note attack time before power limiting.

In an alternate embodiment, the filter may include a high-pass and low-pass filter with variable resistances and the narrowing circuit would sense the amplitude of the input signal and vary the values of the resistance and narrow the bandwidth. This is a feed forward instead of a feedback embodiment.

In using semiconductor output stages, it is desirable to bring the flyback into the inaudible range. This includes placing commutating diodes in parallel with the output transistor and providing zener diodes in series with the conduction path of the output push-pull transistors. The zener diodes breakdown in reverse bias and allow the output terminal to exceed the rail voltage to decrease the flyback dissipation time.

Other objects, advantages and novel features of the present invention will become apparent from the following detailed description of the invention when considered in conjunction with the accompanying drawings.

DETAILED DESCRIPTION OF THE DRAWINGS

A distortion synthesizer which replicates a vacuum tube amplifier having a transformer output would include asymmetrical attenuation of inputs signal and bias point shifting to produce even harmonics and a dynamic filter whose bandwidth narrows as a function of the input signal amplitude above a preselected value. The larger the input signal becomes, the narrower the bandwidth becomes.

Figure 1:
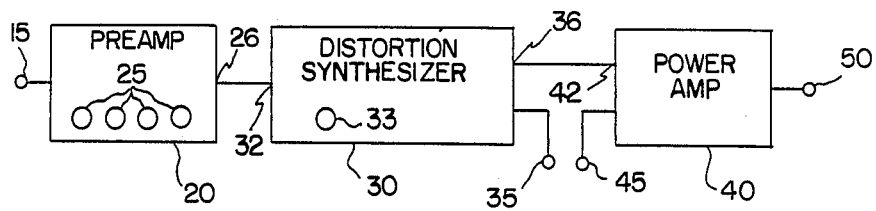
FIG. 1 is a block diagram of an audio amplifier incorporating the principles of the present invention.

An amplifier incorporating the principles of the present invention is illustrated in FIG. 1 as including an input 15 connected to a preamplification or input stage 20. A plurality of adjustments 25 are provided on the preamplifier 20. These include frequency controls, for example, bass and treble, as well as gain control. The output 26 of the preamplifier 20 is connected to the input 32 of distortion synthesizer 30 which replicates the distortion of a vacuum tube amplifier. A variable control 33 is provided to select the distortion tone or the frequency of the distortion synthesizer's filter. The first output 36 of the distortion synthesizer 30 is connected to the input 42 of the power amplifier 40. A second output 35 of the distortion synthesizer 30 is available for connection to other types of effect devices available in the industry. Input 45 provides a second input to the power amplifier stage 40 from other sources other than the source 15 and and more particularly the outputs of the effect devices driven by the signal from output 35. The output of the power amplifier output stage 40 is provided on terminal 50.

Figure 2:
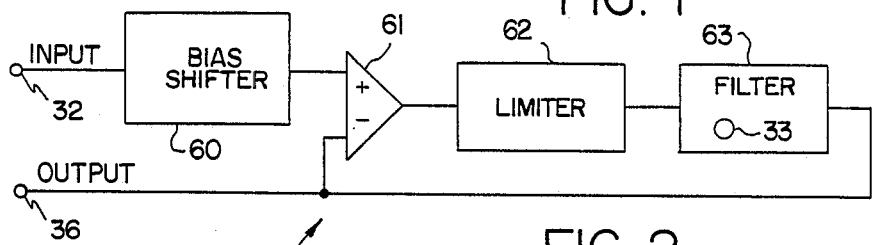
FIG. 2 is a block diagram of a distortion synthesized according to the principles of the present invention.

The block diagram of a preferred embodiment of the distortion synthesizer 30 is shown in FIG. 2. The input 32, after any required preamplification, drives the bias shifter 60 which drives the non-inverting input of amplifier 61. The output of amplifier 61 is limited by limiter 62. The limiter output is then filtered by filter 63 to produce the output 36 and feedback to the inverting input of amplifier 61. The physical realization of these functions is quite well defined by the electronics arts, for example, in a book by Tobey, Graeme, and Huelsman, "Operational Amplifiers, Design and Applications", McGraw-Hill.

The response of this embodiment when the signal is significantly limited, is that of the filter. The gain of the filter can be expressed in FORTRAN as $$F = s * h * x / [(s+w) * (s+x)]$$

where
 s = the Laplace transfer operation
 h = the maximum gain of the filter
 w = the low frequency cutoff in radians/sec.
 x = the high frequency cutoff in radians/sec.

Furthermore, let the output of the amplifier can also be expressed in FORTRAN be $$A = Vp * b - Vm * a$$

where
 Vp = the non-inverting input voltage
 b = the non-inverting gain
 Vm = the inverting input voltage
 a = the inverting output gain Then the response for the above system, when there is no limiting, is $$R = s * b * h * x / ((s+w) * (s+x) + s * a * h * x)$$

which has the following approximate characteristics:
 center frequency gain = b * h/(1 + a * h)
 low frequency cutoff = w/(1 + a * h)
 high frequency cutoff = x * (1 + a * h)

This amplifying system then produces a larger bandwidth with lower low frequency cutoff and higher high frequency cutoff than the filter 63 when a * h is larger than zero and preferably three or larger.

Notice that this block diagram consists of functions that are each well known in the electronics arts that may be implemented with a variety of technologies, vacuum tubes, semiconductors, linear integrated circuits, and digital signal processors.

Figure 3:
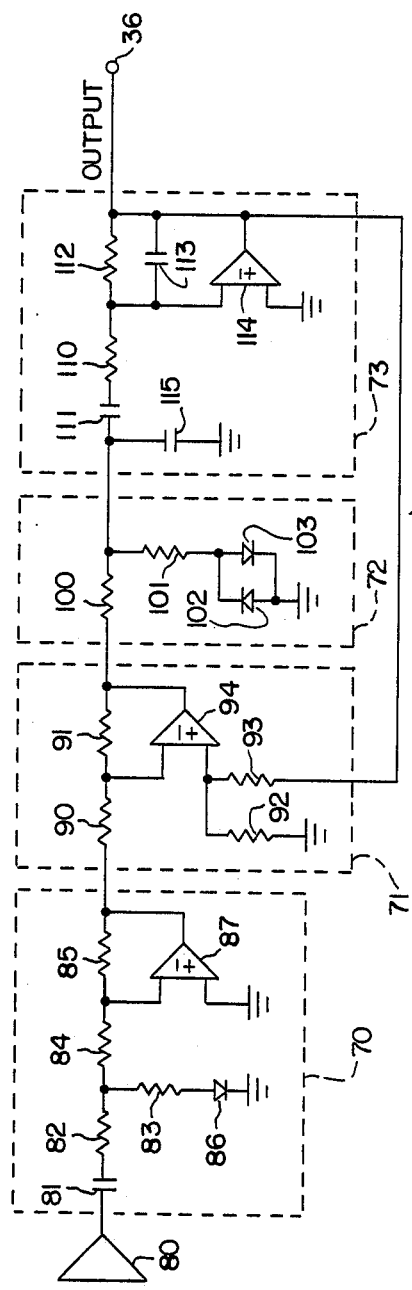
FIG. 3 is a schematic of a distortion synthesized low power level operation according to the principles of the present invention.

An embodiment for the block diagram of FIG. 2 is shown in FIG. 3. The bias shifter 70 is similar to bias shifter 60. The amplifier 71 is similar to amplifier 61 except that actual amplifiers exhibit limiting as their output voltages approach their power supply voltages. The limiter 72 is similar to limiter 62 except that it depends upon the limiting nature of the amplifier 71 and that it provides a reasonably large output impedance for the filtering circuit 73. Again, the filter 73 is similar to filter 63.

The input signal on input 32 is from a preamplifier 80 which is configured as required. The bias shifter 70 is capacitively coupled by capacitor 81. Resistors 82, 84 and 85 form a standard inverting amplifier with operational amplifier 87 until the signal becomes greater than the conduction voltage of diode 86. Then the signal faces the same alterations as the signal through a tube that has grid current, namely, the signal is asymmetrically attenuated and the signal is offset by the charge on capacitor 81. Resistor 83 limits the charging rate of the capacitor 81 and thereby prolongs the bias shifting process gradually on a plurality of cycles. Limiting the charging rate is important because the attack of a note is then not offset while later portions of the note are offset. The limiter 72 can thus create waveforms with more power for the attack on the beginning than for the later portions of the note which is highly distorted. This additional power is needed to achieve the desired musical effects.

The amplifier 71 includes resistors 90 through 93 and an operational amplifier 94. Appropriate choices in resistor values can create the required gains a and b above. The operational amplifier 94 also helps the limiting function 62 by limiting its own output to be between the power supply voltages.

The function of limiter 62 is completed by limiter 72 which uses two resistors 100, 101 and two diodes 102, 103. This specific construction of resistors and diodes not only limits or clips the signal, but also produced harmonics with smaller amplitudes than clippers without resistor 101. The resistor 100 is similar to the unsaturated plate resistance of the output tube, while resistor 101 is similar to the saturated plate resistance. The diodes have a voltage drop similar to the maximum voltage excursion of the plate voltage. These diodes are preferably light emitting diodes chosen for their voltage versus current characteristics. Of course, these similarities are in a proportional sense because inexpensive operational amplifiers have smaller voltages and currents than amplifier output tubes.

The filter 73 is realized with high-pass components 110 and 111, and low-pass components 112 and 113 connected to operational amplifier 114. Capacitor 115 loads the limiter to produce another rolloff in the filter response. This additional reactive component and its consequential additional rolloff produces a twelve decibel per octave rolloff in the audio range for a sweeter distortion toneality.

This filter 73 is a generic representation of a generalized filter. In practice, it is desirable to make the frequency cutoffs variable. This provides the musician or listener distortion tone controls to control the tone of the distortion. Since the feedback extends the frequency response, the distortion tone controls have little effect on the unsaturated operation.

At low input signal levels, the diodes 86, 102 and 103 do not conduct and therefore do not produce any level shifting or limiting. The transfer characteristics of the distortion synthesizer 30 is clear, broad and undistorted. At high input signal levels, the diodes do conduct to produce a narrower band of signals with both even and odd harmonics. The actual values of the above components are chosen quite subjectively. The ultimate design must suit the ear of the musician.

It should be now clear that one of the objectives of this invention has been met in that the frequency response is varied as a function of input signal levels. A guitar amplifier can be synthesized at low power levels by providing the distortion synthesizer 30 of FIGS. 2 and 3 between preamplifier stage 20 and an output power amplifier stage 40. This results from the use of diodes to determine the signal level at which distortion takes place. Furthermore, it can be executed reliably using inexpensive components.

Figure 4:
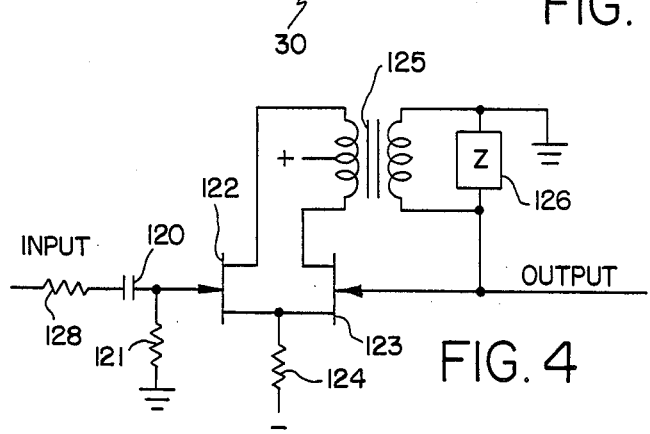
FIG. 4 is a schematic of another distortion synthesized according to the principles of the present invention.

An alternate distortion synthesizer design is shown in FIG. 4. The input is coupled by a capacitor 120 and resistor 128. The resistor 121 biases a junction field effect transistor, JFET 122. This JFET 122 is in a push-pull configuration with JFET 123. They combine to drive transformer 125, which in turn drives a filtering load 126 and provides feedback to JFET 123. In this case, excessive input causes the gate of JFET 122 to conduct and thereby charge. Clipping may be created by sizing resistor 124 to limit the current. Filtering is done by the transformer 125 and load 126.

Although this design uses a few components, it may not be a reliable design because JFETs have broad ranges of characteristics.

The loading of transformer amplifiers with the load 126, which includes a capacitor, will create an additional rolloff which can produce a twelve decibel rolloff in the audio range when this circuit is distorting to further enhance the distortion tone. It is further possible for this capacitor to resonate with the transformer to enhance the desired mid-range response.

The loading of standard tube amplifiers with a capacitive reactance will produce the desirable additional rolloff without significantly diminishing the output power.

An alternate location for resistor 128 is between the capacitor 120 and the JFET 122.

The use of resistor 128 in series with the gate of the JFET 122 limits the bias shifting charging current when the JFET is driven to conducting gate current. This is not usually found in amplifiers because it reduces the circuit gain, especially at high frequencies. But it is necessary in order to give the note that overdrives the amplifier an attack time and as such serves a similar function as resistors 82 and 83 of FIG. 3.

The diode 86 of FIG. 3 and the gate of JFET 122 of FIG. 4 both lead to an asymmetric impedance which changes the charge on a coupling capacitor to create a bias shift as a function of the input signal. There are many other circuit structures that will do this as well, for example, the degeneration shows a dramatic change in input impedance when the transistor saturates. However, unless bias shift were design criteria, a series resistor such as 128 would not be used because it lowers the gain and increases the amplifier noise.

Figure 5:
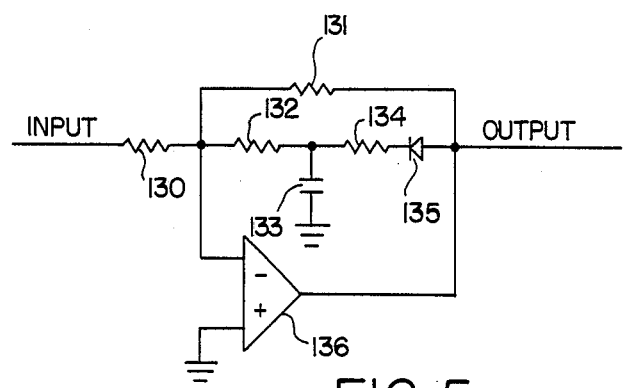
FIG. 5 is a schematic of another bias shifter according to the principles of the present invention.

There are other possibilities for producing the bias shifter 60, such as found in FIG. 5. At low input signal levels the operational amplifier 136 works with resistors 130 and 131 only. But when the output exceeds the voltage drop of diode 135, then capacitor 133 charges up through resistor 134 and the diode 135. Resistor 132 then puts the resulting offset on the input and consequently produces a level dependant offset that will work with a symmetrical clipper to produce both even and odd harmonics.

Note that this circuit may have an asymmetrical gain as opposed to an asymmetrical attenuation of capacitor 81, resistors 82 and 83, and diode 84 of FIG. 3. Whether these circuits have gain or attenuation, they do have an asymmetrical transmission.

Figure 6:
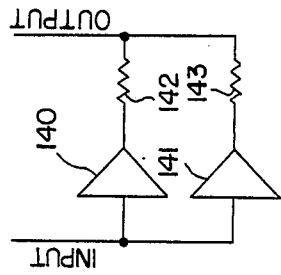
FIG. 6 is a schematic of an alternate limiter according to the principles of the present invention.

The limiting function of the series combination of amplifier 71 and limiter 72 can be duplicated by a parallel combination of amplifiers, such as 140 and 141 in FIG. 6. In FIG. 3, the output of limiter 72 is that of the amplifier 71 until the diodes 102 or 103 conduct. Then the output of the limiter 72 becomes attenuated by resistors 100 and 101 and the voltage vs. current characteristic of diodes 102 and 103. This condition persists until amplifier 71 saturates, then the output of limiter 72 becomes constant.

Amplifiers 140 and 141 have different gains and/or different output saturation levels. The difference in saturation levels can be easily achieved via different supply voltages or currents. In any case, one of the amplifiers, 140 for example, is designed to saturate before 141 saturates. Before amplifier 140 saturates, the output is a function of the gains of both amplifiers and the resistors 142 and 143. When amplifier 140 saturates, its differential gain goes to zero and the output becomes a function of the gain of amplifier 141, the saturation level of amplifier 140 and the resistors 142 and 143. When amplifier 141 saturates the output becomes constant. This behavior performs the same function as limiter 62 and the same function as the combination of the saturation of amplifier 71 and limiter 72.

The limiting art is repleat with many forms of limiters; some are found in the aforementioned text by Tobey, Graeme and Huelsman. Limiters may be a shunt as 72, series or parallel. Limiter 62 may be reduced to the saturation effects found in amplifier 71 for harder limiting or limiter 72 may be expanded with more diodes for even softer limiting. Similarly, additional amplifiers and resistors may be added to the circuit of FIG. 6.

A useful distortion circuit is the combination of circuits 70 and 72 which produces even harmonic distortion as desired although without the change in frequency response.

Figure 7:
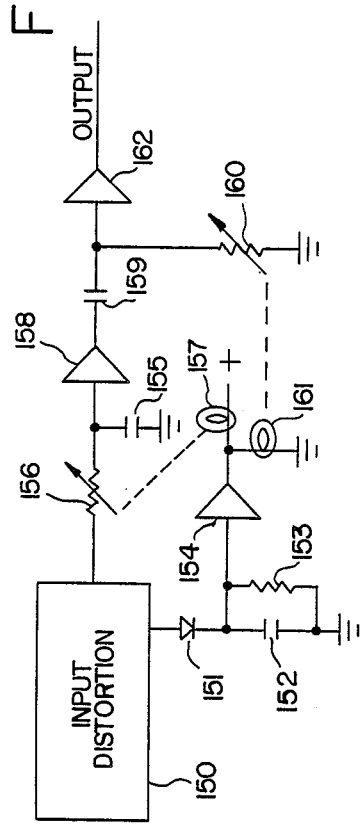
FIG. 7 is a schematic of a feed forward distortion synthesizer.

Another possibility for a distortion synthesizer or a frequency responsive amplifier dependent upon the signal level is shown in FIG. 7. The input is supplied by a distortion circuit 150 as shown herein as the aforementioned combination of 70 and 72 in FIG. 3, or in other art. The strength of the signal is detected by diode 151, capacitor 152, resistor 153 and amplifier 154. When the signal is low, lamp 157 is fully lit. When the signal is high, lamp 161 is fully lit. At intermediate signals, both lamps are partially lit. The signal from distortion circuit 150 also passes through a light sensitive resistor 156 which is dependent upon the light from lamp 157. This resistor 156 and capacitor 155 form a low-pass filter whose cutoff frequency is dependent upon the input signal strength.

When the input signal is low and light 157 shines brightly, resistor 156 has a low value and the cut off frequency of the low-pass filter 155, 156 is high. As the input signal increases, light 157 dims, thereby increasing the value of resistor 156 and lowering the cut off frequency of low-pass filter 155, 156.

Amplifier 158 buffers the signal for the next filter formed with capacitor 159 and light sensitive resistor 160 which is dependent upon lamp 161. The cut off frequency of the high-pass filter is dependent upon the signal strength. When the input signal is low and light 161 is off, resistor 160 has a high value and the cut off frequency of the high-pass filter 159, 160 is low. As the input signal increases, light 161 begins to shine, thereby decreasing the value of resistor 160 and raising the cut off frequency of high-pass filter 159, 160.

These various examples show a general theme of synthesizing the operation of a tube amplifier with semiconductors by using a circuit which has a frequency response dependent upon the input signal level. It is further conceivable that a tube amplifier could be designed to limit or clip without drawing grid current and thereby produce even harmonic distortion. Consequently, the even harmonic distortion circuits are not necessary to synthesizing the tube operation, but are desirable since the even harmonics are more musical.

Figure 8:
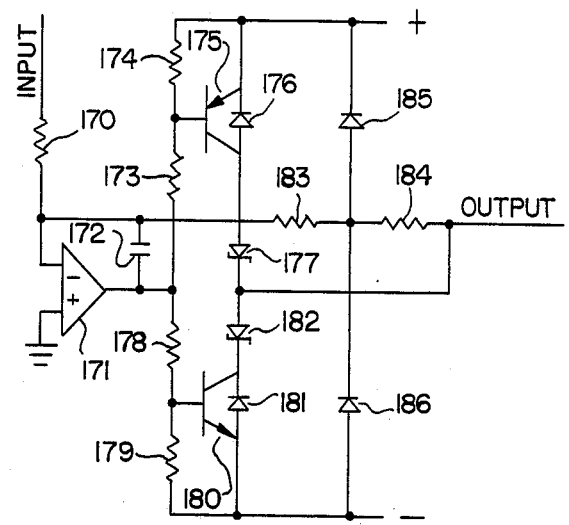
FIG. 8 is a schematic of a semiconductor output stage featuring enhanced flyback capability according to the principles of the present invention.

The output impedance of the amplifier is first determined by the feedback from the output and second by the output stage itself. When the output stage is saturated, then the feedback is not effective and the output impedance is determined by the output stage itself. As described above, the output impedance of a saturated tube stage to flyback currents is quite high. This is quite unlike the output impedance of a saturated semiconductor which is quite low. The simple inclusion of a diode in series with a semiconductor could reverse this situation. FIG. 8 depicts such an output stage. Notice that this stage does not use the usual follower configuration found in most semiconductor amplifiers because the series diodes does not work well with that circuit structure.

With reference to FIG. 8, the input to the amplifier is resistor 170 which drives operational amplifier 171 in the typical inverting fashion. Capacitor 172 provides stabilizing often needed when including operational amplifiers in voltage gain circuits. Resistors 173 and 174 shift the operating level of the operational amplifier output signal to drive transistor 175. Diode 176 keeps this transistor from being excessively reverse biased. Diode 177 keeps the flyback current from flowing in diode 176. It is preferable, however, to use a zener diode for diode 177 to catch the flyback at an elevated voltage so that the breakdown voltage of transistor 180 is not exceeded. Similarly, resistors 178 and 179 shift the operating level of drive transistor 180. Diode 181 keeps transistor 180 from being excessively reverse biased. Diode 182 keeps the flyback current from initially flowing in diode 181. It is also preferably a zener so that the flyback is limited to a high voltage to avoid exceeding the breakdown voltage of transistor 175, yet reduce the flyback time into the inaudible frequency range. The clamped flyback currents also flow through the commutation diodes 176 and 181 of transistors 176 and 181. The feedback is supplied by resistors 183 and 184. If the output should exceed the power supply voltages, the feedback is clamped by one of the diodes 185 or 186.

Although there are many ways of configuring the above amplifier, one of the important and novel features is the use of the diodes 177 and 182 to avoid clamping the flyback at the supply rails. These diodes may be zener diodes to insure that the breakdown voltage of the output transistors is not exceeded.

By way of example, assume initially that transistor 175 is on and transistor 180 is off. Zener diode 177 is forward biased and the output is pulled up to the plus rail. When the input signal disappears, transistor 175 turns off. The output continues dropping and producing flyback which will increase to greater than the negative rail by an amount sufficient to overcome the reverse breakdown bias of zener diode 182 and the forward breakdown voltage of 181, they turn on. This provides a path for the flyback current. By selecting the voltage drop of diodes 176, 177, 181 and 182, the load from the output will allow flyback to greater than the rail voltages and thereby decrease the amount of time of flyback and maintains this distortion in the inaudible range. The operation of transistor 180 and its relationship to diodes 176 and 177 in flyback with respect to a positive going flyback signal is similar to that just described for transistor 175 and diodes 181 and 182

The diodes 177 and 182 are used to keep the flyback from being clamped at the supply voltages and consequently provide a high impedance output to the flyback so that the flyback duration can be reduced to inaudible. However, the negative feedback must also be defeated since negative feedback will reduce the output impedance. The diodes 185 and 186 defeat the negative feedback for sufficiently large flyback. The resistance of 184 should be small relative to the resistance of 183. This is needed when this output stage is driven by a low power level tube synthesizer such as the one shown in FIG. 3. This circuit produces a limited signal and the flyback should be given the opportunity to dissipate in a short time to be inaudible.

Figure 9:
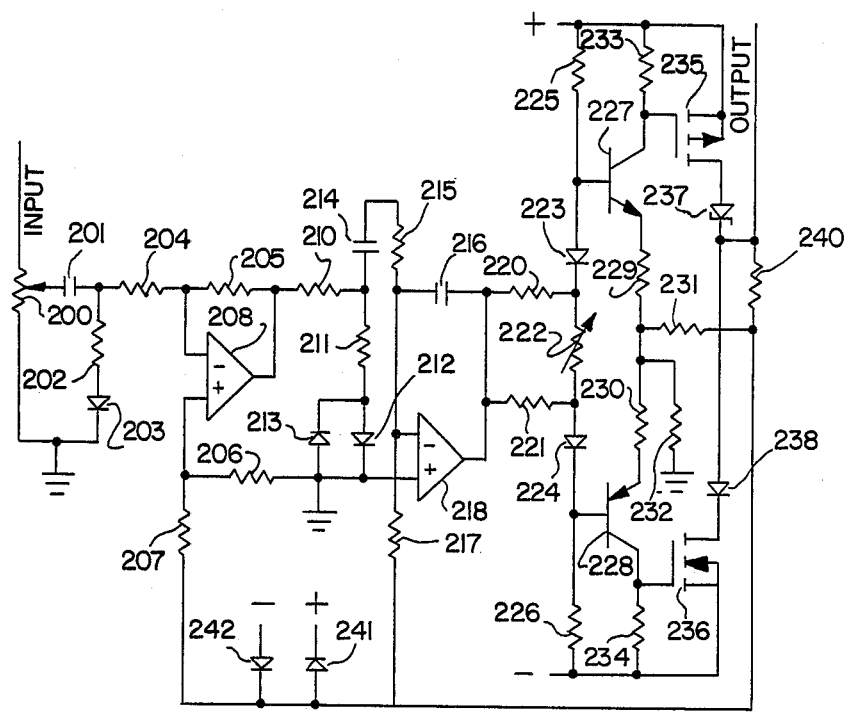
FIG. 9 is an embodiment of a semiconductor amplifier which synthesizes a vacuum tube amplifier.

FIG. 9 depicts a preferred embodiment of the semiconductor power amplifier with tube amplifier synthesis. This schematic is a combination of the principles of the schematics of FIGS. 3 and 8. The input signal is received by a potentiometer 200 and is coupled to the circuit at operational amplifier 208 by capacitor 201. Resistor 202 and diode 203 produce the bias shift effect on signals which exceed the conduction voltage of diode 203. Resistors 204 through 207 and operational amplifier 208 form an amplifier similar to 71. Resistors 210 and 211 combined with diodes 212 and 213 form the limiter similar to 72.

The filter 73 of FIG. 3 has been combined with the power stage of FIG. 8 to form the balance of the circuitry in FIG. 9. The capacitor 214 and resistor 215 provide high-pass filtering action. The capacitor 216 helps to stabilize operational amplifier 218 and with resistor 217 forms a low-pass filter. The output of amplifier 218 drives a biasing network made of resistors 220, 221, 222, 225 and 226 and diodes 223 and 224. This network biases the driving transistors 227 and 228. The emitters of transistors 227 and 228 are degenerated with resistors 229 and 230. The emitters also receive clamped feedback via resistors 231 and 232. The collectors of transistors 227 and 228 drive resistors 233 and 234 and drive output transistors 235 and 236 respectively. The drains of transistors 235 and 236 are connected to the output by diodes 237 and 238. These diodes are preferably zener diodes so that they will also clamp the flyback to safe voltages with the help of the commutation diodes normally found in the transistors 235 and 236. The feedback limiter consists of resistor 240 and diodes 241 and 242.

An alternative flyback clamping means is formed by placing zeners in parallel with the output transistors 176, 181, 235 and 236 and using standard diodes for diodes 177, 182, 237 and 238. The advantage is more assurance that the breakdown voltages of the output devices will not be exceeded at the disadvantage of requiring more parts.

The operation of a distortion synthesizer that simulates the input to output characteristics of a tube amplifier has been described. This circuit may be implemented in a variety of ways, with semiconductors or tubes, with transformers or filters, just not tubes and transformers since that is the art being synthesized.

Furthermore, one may, as shown in FIG. 7, create the limiting with a narrowing of the frequency response in a feed forward manner as well as a feedback manner. The even harmonics may be generated with a variety of diode paths, such as in FIGS. 4 and 5. The limiter may also be created in a variety of ways, including the parallel amplifier structure of FIG. 6. The other portion of the tube amplifier synthesis is the creation of a high output impedance for speaker inductance induced flyback voltages.

One familiar with the amplifier and electronic arts can create tube amplifier synthesizers other than described above. Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. A distortion synthesizer comprising:
   transformerless filter means having a pass bandwidth between a high and low frequency cutoff; and
   means for narrowing said bandwidth of said filter means as a function of amplitude of an input signal to said distortion synthesizer above a preselected value within an upper portion of an operating range.

2. A distortion synthesizer according to claim 1 including an input terminal for receiving said input signal, an output terminal connected to an output of said filter means and an amplifier means having a first input connected to said input terminal and having an output, and feedback means connecting said output of said filter means to a second input of said amplifier means; and
   wherein said narrowing means includes a limiting means connected between said output of said amplifier means and an input of said filter means.

3. A distortion synthesizer according to claim 2, wherein said limiting means includes a pair of parallel connected opposite conducting diodes in series with a resistor.

4. A distortion synthesizer according to claim 2, wherein said filter means includes means for selecting frequency response of said filter means.

5. A distortion synthesizer according to claim 2 including bias shifter means connecting said input terminal to said amplifier means first input for asymmetrically transmitting input signals.

6. A distortion synthesizer according to claim 2, wherein said limiting means includes means for limiting the signal amplitude without producing excessively high harmonic amplitudes.

7. A distortion synthesizer according to claim 2, wherein said filtering means includes means for producing a rolloff greater than 6 decibels per octave in the audio range.

8. A distortion synthesizer according to claim 1, wherein said filter means includes a filter with a variable cutoff frequency; and said narrowing means includes means for sensing said input signal and varying said filter cutoff frequency in response to said input signal.

9. A distortion synthesizer according to claim 1, wherein:
said filter means includes high pass filter with a variable resistance and a low pass filter with a variable resistance; and
said narrowing means includes means for sensing said amplitude of said input signal and varying both of said variable resistances to narrow the bandwidth of said filter means.

10. A distortion synthesizer according to claim 1, wherein said narrowing means includes means for minimizing the production of higher order harmonics.

11. A distortion synthesizer comprising:
transformerless filter means having a bandwidth;
means for narrowing said bandwidth of said filter means as a function of amplitude of an input signal to said distortion synthesizer; and
means for introducing even harmonics as a function of the signal amplitude of said input.

12. A distortion synthesizer according to claim 11, wherein said introducing means includes means for asymmetrically transmitting said input signal and limiting means for symmetrically limiting said asymmetrically transmitted input signal.

13. A distortion synthesizer comprising:
an input terminal and an output terminal;
amplifier means having first and second inputs and an output;
bias shifter means connecting said input terminal to said first input of said amplifier means for asymmetrically transmitting input signals above a preselected value;
separate limiter means connected to the output of said amplifier means for limiting the output of said amplifier means;
filter means connecting said limiter means to said output terminal; and
feedback means connecting said output terminal to said second input of said amplifier means.

14. A distortion synthesizer according to claim 13, wherein said bias shifter means includes a capacitor for storing an offset voltage and a diode means for creating said offset voltage.

15. A distortion synthesizer according to claim 14, wherein said diode means includes a resistor means for limiting the rate at which said offset voltage is created.

16. A distortion synthesizer according to claim 13, wherein said bias shifter means includes a second amplifier means having a feedback responsive to the charge on a capacitor and including a diode means for charging said capacitor.

17. A distortion synthesizer according to claim 13, wherein said filter means includes a high pass filter.

18. A distortion synthesizer according to claim 17, wherein said filter means includes means for producing a rolloff greater than 6 decibels per octave in the audio range.

19. A distortion synthesizer according to claim 17, wherein said filter means includes a low pass filter.

20. A distortion synthesizer according to claim 13, wherein said amplifier means and said limiter means includes a pair of parallel amplifiers having different saturation levels to perform amplification and limiting.

21. A distortion synthesizer comprising:
an input terminal and an output terminal;
amplifier means having a first input connected to said input terminal, a second input and an output;
separate limiter means connected to the output of said amplifier means for limiting the output of said amplifier means;
filter means connecting said limiter means to said output terminal; and
feedback means connecting said output terminal to said second input of said amplifier means.

22. A distortion synthesizer according to claim 21, wherein said filter means includes a high pass filter.

23. A distortion synthesizer according to claim 22, wherein said filter means exhibits a rolloff greater than 6 decibels per octave in the audio range.

24. A distortion synthesizer according to claim 22, wherein said filter includes a low pass filter.

25. A distortion synthesizer according to claim 21, wherein said filtering means includes means for producing a rolloff greater than 6 decibels per octave in the audio range.

26. A distortion synthesizer comprising:
an input terminal and an output terminal;
amplifier means having an input connected to said input terminal and an output; and
a transformerless filter means connecting said output of said amplifier means and said output terminal for narrowing the frequency response of said distortion synthesizer for an input signal applied to said input terminal which has an amplitude above a preselected value within an upper portion of an operating range.

27. A distortion synthesizer according to claim 26, wherein said filter means includes a limiter and band pass filter in series and a feedback connecting the output of said filter to the input of said amplifier means.

28. A distortion synthesizer according to claim 26, including input distortion means connected between said input terminal and said input of said amplifier means for introducing even harmonic distortion into said input of said amplifier means for input signals above a preselected value.

29. A distortion synthesizer according to claim 28, wherein said distortion means includes a capacitor in series with said input of said amplifier means and an asymmetrical impedance means connected between said input of said amplifier means and a reference voltage and activated by input signals above said preselected value.

* * * * *